United States Patent
Ha et al.

(10) Patent No.: US 10,910,994 B2
(45) Date of Patent: Feb. 2, 2021

(54) METHOD FOR DETECTING FAULTS IN A PHOTOVOLTAIC MODULE

(71) Applicant: Commissariat a l'energie atomique et aux energies alternatives, Paris (FR)

(72) Inventors: Duy Long Ha, Chambery le Vieux (FR); Franck Al Shakarchi, Saint-Sulpice (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 93 days.

(21) Appl. No.: 16/166,727

(22) Filed: Oct. 22, 2018

(65) Prior Publication Data
US 2019/0123684 A1    Apr. 25, 2019

(30) Foreign Application Priority Data

Oct. 23, 2017   (FR) ..................................... 17 60003

(51) Int. Cl.
*H02S 50/10* (2014.01)
*H01L 31/044* (2014.01)

(52) U.S. Cl.
CPC ............ *H02S 50/10* (2014.12); *H01L 31/044* (2014.12)

(58) Field of Classification Search
CPC ....... H02S 50/10; H01L 31/044; H01L 23/38; H01L 23/427; G01R 31/2619; G01R 31/2642
USPC ............... 324/500, 600, 764.01, 103 R, 771, 324/761.01, 501, 639, 642, 702, 76.11, 324/76.66, 96
See application file for complete search history.

(56) References Cited

U.S. PATENT DOCUMENTS

| | | |
|---|---|---|
| 2015/0207456 A1* | 7/2015 | Han .................... H02M 7/48 136/244 |
| 2016/0245860 A1 | 8/2016 | Schmidt |
| 2017/0063304 A1* | 3/2017 | Ko ...................... H01L 31/0201 |

FOREIGN PATENT DOCUMENTS

WO    WO 2016/189052 A1    12/2016

OTHER PUBLICATIONS

French Preliminary Search Report dated Jan. 25, 2018 in French Application 17 60003 filed on Oct. 23, 2017 (with English Translation of Categories of Cited Documents and Written Opinion).

* cited by examiner

*Primary Examiner* — Vincent Q Nguyen
*Assistant Examiner* — Trung Nguyen
(74) *Attorney, Agent, or Firm* — Oblon, McClelland, Maier & Neustadt, L.L.P.

(57) ABSTRACT

A method for detecting a fault in a photovoltaic module includes determining a matrix of temperatures of the photovoltaic module, the matrix being obtained after dividing the module into a plurality of thermal zones and assigning a temperature to each thermal zone; detecting at least one hot thermal zone from among the plurality of zones of the module; determining a surface area ratio between the surface area of the detected hot thermal zone and the total surface area of the module; performing a first comparison of the surface area ratio with a coefficient dependent on the number of bypass diodes present in the module; and determining the type of fault from the result obtained in said first comparison.

12 Claims, 4 Drawing Sheets

METHOD FOR DETECTING FAULTS IN A PHOTOVOLTAIC MODULE

TECHNICAL FIELD OF THE INVENTION

The present invention pertains to a method for detecting faults in a photovoltaic module.

The invention also relates to a detection system configured to implement said detection method.

PRIOR ART

A photovoltaic architecture, as a general rule, includes a plurality of strings of photovoltaic modules (also called photovoltaic panels or solar panels) that are connected in parallel. In each string, the photovoltaic modules are connected in series. Each photovoltaic module includes a plurality of photovoltaic cells connected in series, in the form of rows of cells. Each photovoltaic cell is intended to convert solar energy into electrical energy. The strings of photovoltaic modules are linked to a converter, for example an inverter. This converter makes it possible to convert the DC voltage supplied by each string of modules into an AC voltage. The converter also has the role of determining an operating point for which the power delivered by a string of photovoltaic modules is at a maximum (maximum power point, denoted MPP).

It is necessary to monitor the operating state of each photovoltaic module of a string in order to spot any possible fault with a module and to mitigate it as quickly as possible. As the case may be, the fault may be of various types, in particular a permanent one if it involves a hardware problem or a temporary one if it involves for example the presence of a shadow or of dust on the module.

There are various solutions for monitoring the operating state of a photovoltaic module.

Some solutions use current and voltage sensors to check the electrical behaviour of the module. Document WO2015/118608 describes such a method based on the I-V curve of a photovoltaic cell. However, this solution is very expensive if it is desired to install it on all of the modules of an architecture.

Other solutions use temperature sensors. This is the case for example of U.S. Pat. No. 6,512,458B1 and application US2011/088744A1, which describe solutions in which temperature sensors are intended to measure the temperature at the bypass diodes in order to deduce therefrom a possible fault on the bypassed cells. Patent application US2011/316343A1, for its part, describes a photovoltaic module including a plurality of interconnected cells, in which each cell is associated with a control unit that includes a power sensor and a temperature sensor for monitoring the integrity of the cell.

Lastly, other solutions use thermal cameras to spot possible hotspots on the modules after an electrical stimulation. Thermal imaging detection solutions are highly constrictive and unreliable, in particular for detecting temporary or intermittent faults. In addition, they often require maintenance operators to pass in front of each module with the thermal camera and then to interpret the image obtained, which may prove difficult to implement.

Patent application WO2016/189052A1 also describes a method for detecting a fault in a photovoltaic module.

There is a need to provide a simple, reliable and inexpensive solution that makes it possible to monitor the state of a photovoltaic module and that, if the presence of a fault is detected, makes it possible to determine the type of fault.

DISCLOSURE OF THE INVENTION

The method of the invention makes it possible to meet this need.

This method allows detection of a fault in a photovoltaic module that includes a plurality of photovoltaic cells connected to one another and one or more bypass diodes, each bypass diode being configured to bypass one or more photovoltaic cells of said photovoltaic module, this method including the following steps:

Determining a matrix of temperatures of the photovoltaic module, said matrix being obtained after dividing the module into a plurality of thermal zones and assigning a temperature to each thermal zone;

Detecting at least one hot thermal zone from among said plurality of zones of the module;

Determining a surface area ratio between the surface area of the detected hot thermal zone and the total surface area of the module;

A first comparison of said surface area ratio with a coefficient dependent on the number of bypass diodes present in the module;

Determining the type of fault from the result obtained in said first comparison.

According to one particular feature, said first comparison consists in comparing said surface area ratio with said coefficient equal to 1/N, wherein N corresponds to the number of bypass diodes present in the module, for the purpose of obtaining a first option or a second option according to said result of the comparison.

According to another particular feature, in said first option, the method includes steps of:

Determining a temperature difference between said average temperature of the photovoltaic module and a reference temperature obtained on a reference photovoltaic module;

A second comparison of said temperature difference with a threshold value;

Determining the type of fault from the result of said second comparison between an overall failure of the module and a hotspot fault.

According to another particular feature, when the fault is a hotspot fault, the method consists in determining an energy production loss of the photovoltaic module caused by said hotspot fault.

According to another particular feature, in said second option, it includes steps of:

Obtaining a maximum temperature of said detected hot thermal zone;

A third comparison of said maximum temperature with a threshold value greater than an average value of the temperatures of said reference module;

Determining the type of fault from the result of said third comparison between an overall failure of the module and another type of fault.

According to another particular feature, when another type of fault is involved, it includes a step of determining the number of faulty bypass diodes.

The invention also relates to a system for detecting a fault in a photovoltaic module that includes a plurality of photovoltaic cells connected to one another and one or more bypass diodes, each bypass diode being configured to bypass one or more photovoltaic cells of said photovoltaic module, characterized in that it includes: A module for determining a matrix of temperatures of the photovoltaic module, said matrix being obtained after dividing the module into a plurality of thermal zones and assigning a temperature to each thermal zone;

A module for detecting at least one hot thermal zone from among said plurality of zones of the module;

A module for determining a surface area ratio between the surface area of the detected hot thermal zone and the total surface area of the module;

A first comparison module configured to implement a comparison of said surface area ratio with a coefficient dependent on the number of bypass diodes present in the module;

A module for determining the type of fault from the result obtained by said first comparison module.

According to one particular feature, said first comparison module is configured to compare said surface area ratio with said coefficient equal to 1/N, wherein N corresponds to the number of bypass diodes present in the module, for the purpose of obtaining a first option or a second option according to said result of the comparison.

According to another particular feature, in said first option, it is configured to execute:

A module for determining a temperature difference between an average temperature of the photovoltaic module and a reference temperature obtained on a reference photovoltaic module;

A second comparison module configured to implement a comparison of said temperature difference with a threshold value;

A module for determining the type of fault from the result of said comparison implemented by said second comparison module, between an overall failure of the module and a hotspot fault.

According to another particular feature, when the fault is a hotspot fault, the system is configured to execute a module for determining an energy production loss of the photovoltaic module caused by said hotspot fault.

According to another particular feature, in said second option, the system is configured to execute:

A module for obtaining a maximum temperature of said detected hot zone;

A third comparison module configured to implement a comparison of said maximum temperature with a threshold value greater than an average value of the temperatures of said reference module;

A module for determining the type of fault from the result of said comparison implemented by said third comparison module, between an overall failure of the module and another type of fault.

According to another particular feature, when another type of fault is involved, the system is configured to execute a module for determining the number of faulty bypass diodes.

BRIEF DESCRIPTION OF THE FIGURES

Other features and advantages will become apparent in the following detailed description that is provided with reference to the appended drawings, in which.

DETAILED DESCRIPTION OF AT LEAST ONE EMBODIMENT

Figure 1:
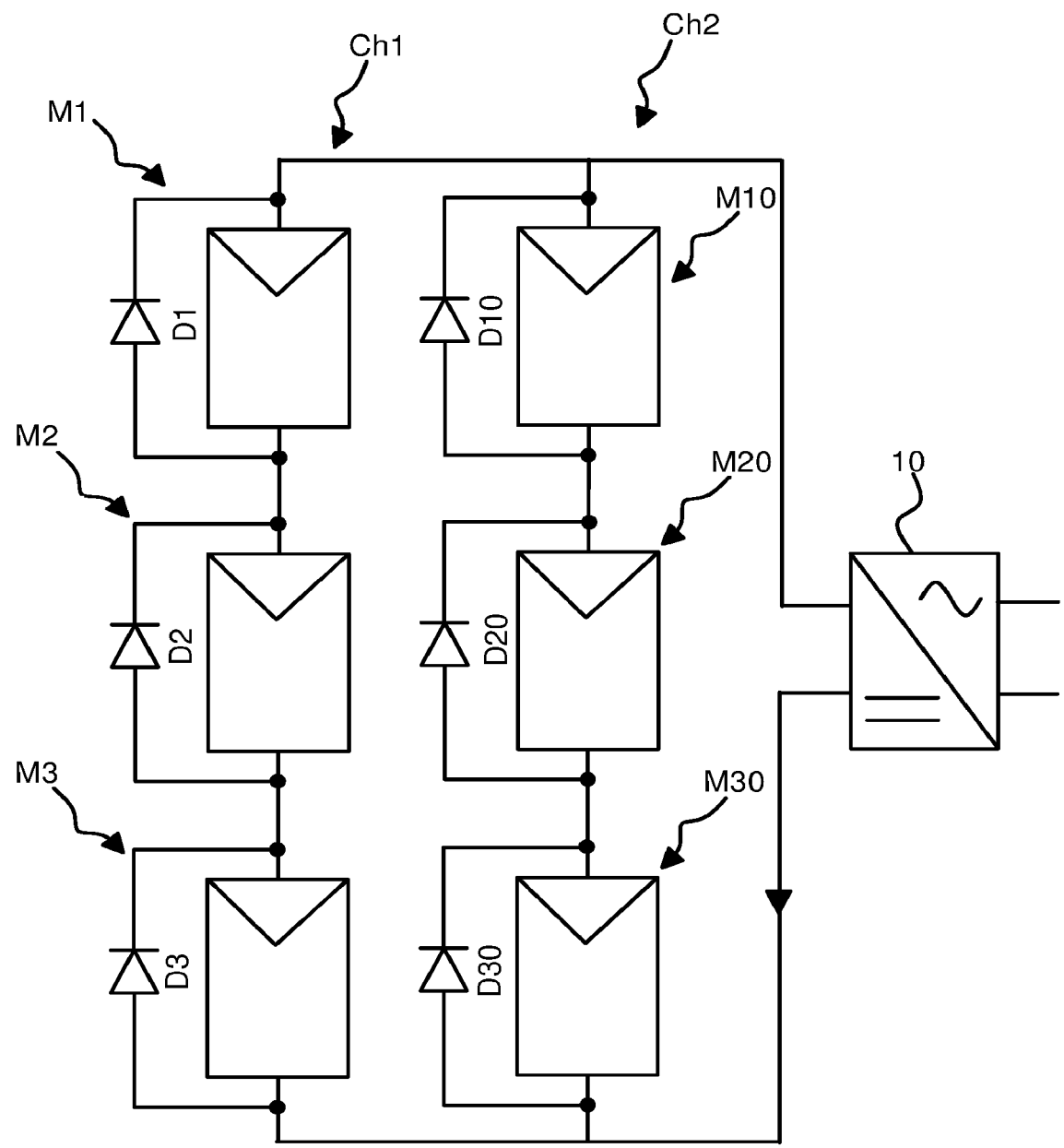
FIG. 1 schematically shows a conventional photovoltaic architecture.

With reference to FIG. 1, a photovoltaic architecture typically has the following particular features in terms of layout and in terms of operation:

A plurality of strings Ch1, Ch2 of photovoltaic modules (also called photovoltaic panels or solar panels) are connected in parallel (two strings in FIG. 1).

Each string of photovoltaic modules includes a plurality of photovoltaic modules connected in series (M1-M3 for string Ch1 and M10-M30 for string Ch2).

A photovoltaic module (generally referenced Mi in the remainder of the text) includes a plurality of photovoltaic cells (not shown) connected in series. The photovoltaic cells are distributed into a plurality of rows. A row may include one or more photovoltaic cells.

Each photovoltaic cell is intended to convert solar energy into electrical energy.

A converter, for example an inverter 10, including a plurality of switching arms based on transistors, is intended to convert a DC voltage supplied by each string of modules into an AC voltage.

Control means, integrated or not integrated into the converter, are able to control the inverter so as to perform the voltage conversion.

Each module advantageously includes non-return diodes (not shown) positioned in an appropriate manner, for example in series with the modules of each string.

Each module advantageously includes what are called bypass diodes, each for bypassing a row of separate cells of a module if a cell in this row were to be faulty. In FIG. 1, one bypass diode is shown per module (the diodes are referenced D1, D2, D3, D10, D20, D30 in FIG. 1).

Figure 2:
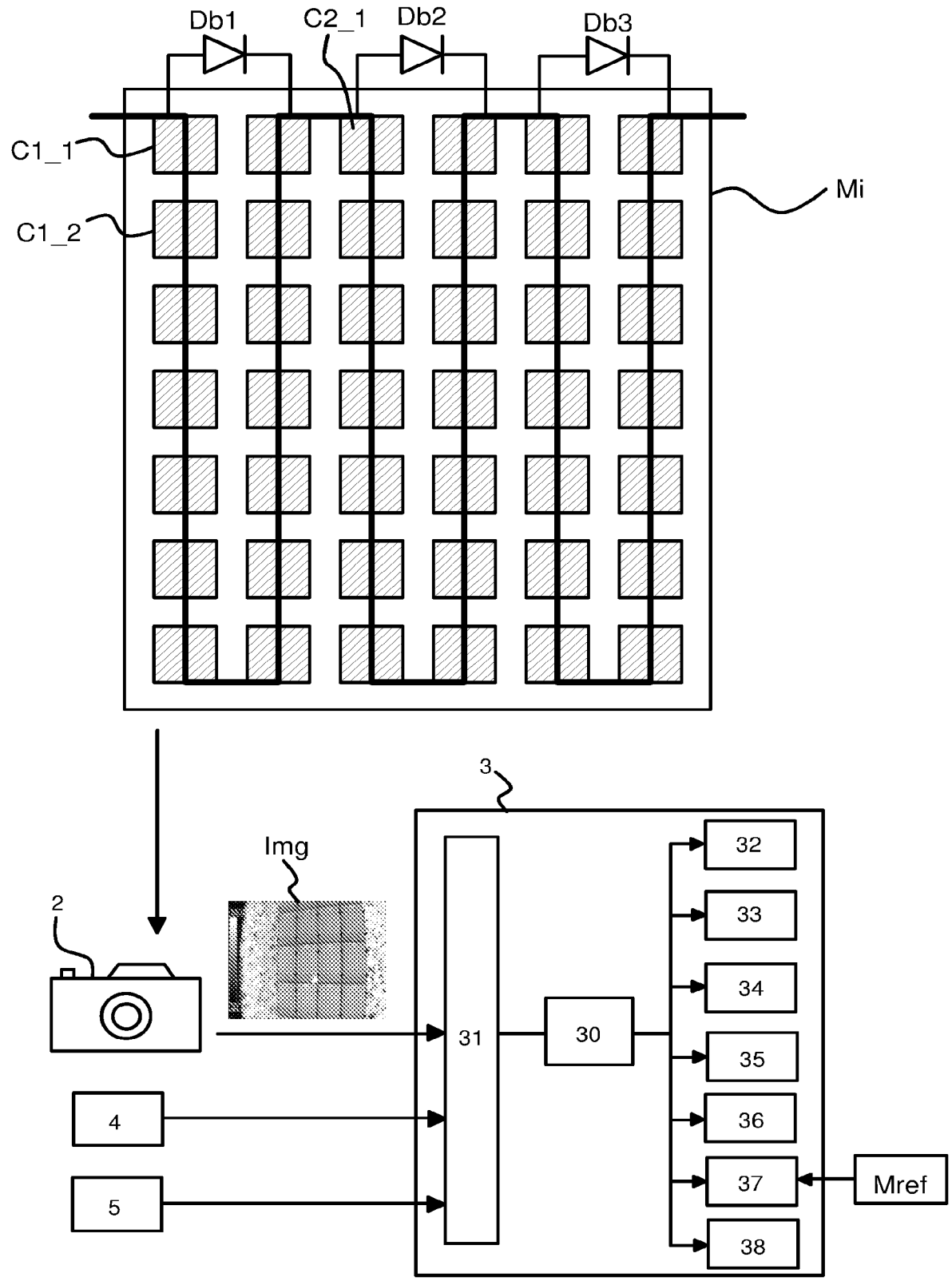
FIG. 2 schematically shows the simplified structure of a photovoltaic module with which the detection system of the invention is associated.

With reference to FIG. 2, in each module, the following layout is present:

The photovoltaic cells are organized into a plurality of rows or groups. In FIG. 2, two columns of cells form a row of cells. In this figure, the cell referenced C1_1 corresponds to the first cell of the first row and the cell referenced C1_2 corresponds to the second cell of the first row. The cell referenced C2_1 corresponds to the first cell of the second row. In the remainder of the description, each cell is generally referenced Cx, where x corresponds to the reference of the cell.

In FIG. 2, a separate bypass diode Db1, Db2, Db3 is associated with each row of cells shown. In FIG. 2, a row of cells includes a plurality of cells, but it could include just a single cell.

The invention aims in particular to detect the presence of a fault in a photovoltaic module Mi during operation, and to determine the type of fault detected. This method is implemented by virtue of a suitable detection system. In the remainder of the description, the photovoltaic module that forms the subject of the evaluation is denoted "monitored module". Each hot thermal zone is denoted Zh.

It is possible in particular to distinguish between three types of fault on a photovoltaic module:

1st type: Hotspot fault. This type of fault may be caused by a fracture on a cell of the module, by shading, by a short-circuited cell, by a breakage at one of the interconnection strips linking the cells to one another, by delamination or by the presence of corrosion.

2nd type: Fault consisting in the failure of one or more bypass diodes.

3rd type: Complete module malfunctioning. This fault may be caused by a fracture of a plurality of cells, by the PID (potential-induced degradation) effect or by the failure of all of the bypass diodes. In this situation, the energy loss of the photovoltaic module is equal to 100%.

With reference to FIG. 2, the detection system includes means for acquiring data representative of temperature values on the photovoltaic module during operation. These acquisition means may be a thermal camera 2 intended to take a thermal image Img of the surface of the monitored photovoltaic module. The acquisition means may be temperature sensors distributed on each cell or on a set of photovoltaic cells of the monitored module and positioned appropriately on the rear face of the module. Any other solution could be used. In FIG. 2, a thermal camera is shown and supplies a thermal image Img of the module to the central unit 3. The camera may be carried by an operator or installed on a drone that is intended to fly over the photovoltaic installation.

The detection system includes a processing unit 3 or calculator. This processing unit 3 may be connected to the acquisition means that are used, such as the thermal camera 2, so as to receive said data (the image Img). Any wired or wireless connection solution may be contemplated.

The processing unit 3 includes a microprocessor 30 and storage means. This may be a portable computer or a mobile terminal. The thermal camera 2 may be combined with the processing unit 3 in one and the same housing.

The system may include a device 4 for measuring the ambient temperature and a device 5 for measuring the irradiance. These data may be useful to the processing unit for the purpose of establishing more advanced diagnoses.

The processing unit 3 may include a communication module 31 configured to communicate with the thermal camera 2 and the devices 4, 5.

The processing unit 3 includes software modules executed by the microprocessor 30 in order in particular to implement the fault detection method of the invention.

The processing unit 3 may include a module 32 for dividing or for breaking down a thermal image. This module is executed upon request by the microprocessor 30 when a thermal image has been acquired.

The division may consist in breaking the thermal image down into a plurality of zones. This is achieved by image processing implemented by the processing unit.

Each temperature zone is characterized by its own temperature that is uniform or virtually uniform over the entire zone. Two adjacent thermal zones have a sufficient temperature difference between them, for example greater than a certain threshold (for example 10° C.). Virtually uniform is intended to mean that the temperature may vary from one spot to another in the thermal zone, but that the temperature difference between two spots of one and the same zone still remains below said threshold. A determined temperature representative of the temperature of the zone is then associated with each thermal zone. This temperature, assigned to each zone, may be an average temperature determined from all of the temperatures of the zone.

Of course, the same division into a plurality of thermal zones may be achieved using data supplied by the temperature sensors.

The processing unit 3 may include a module 33 for determining the respective surface areas of the various divided thermal zones.

The processing unit 3 may include a module 34 for determining a matrix of temperatures, the matrix of temperatures consisting, after the monitored module has been divided into a plurality of zones, in assigning a temperature to each zone.

The processing unit 3 may include a module 35 for detecting each hot thermal zone Zh from said matrix.

A hot thermal zone Zh corresponds to a zone for which the temperature differs considerably from the temperatures of the other zones of the module. A hot thermal zone Zh is understood to mean a thermal zone for which the temperature exceeds a certain threshold. This threshold will be equal for example to a reference temperature plus a temperature delta.

The processing unit 3 may include a module 36 for obtaining the reference temperature Tref from a module designated as reference module Mref.

The reference temperature Tref is the temperature of a reference module Mref considered to be healthy, that is to say without an operating fault. The reference module Mref is a photovoltaic module analogous to the monitored photovoltaic module (that is to say having the same technical features) but that is not defective. It is advantageously present in the same photovoltaic architecture as the monitored module. The reference temperature may be obtained in a manner identical to that used for the monitored module, that is to say from a thermal image of the module and/or from temperature sensors positioned on the rear face of the reference module. The temperature data of the reference module may be sent to the processing unit 3, which may then calculate the reference temperature using the appropriate module 36. This reference temperature Tref corresponds to the average temperature of the reference module Mref.

The processing unit 3 includes a module 37 for determining the type of fault present in a photovoltaic module Mi, which is for example executed after detection of at least one hot thermal zone Zh on the module. This module for detecting the type of fault may in particular use the other modules outlined above.

Figure 3:
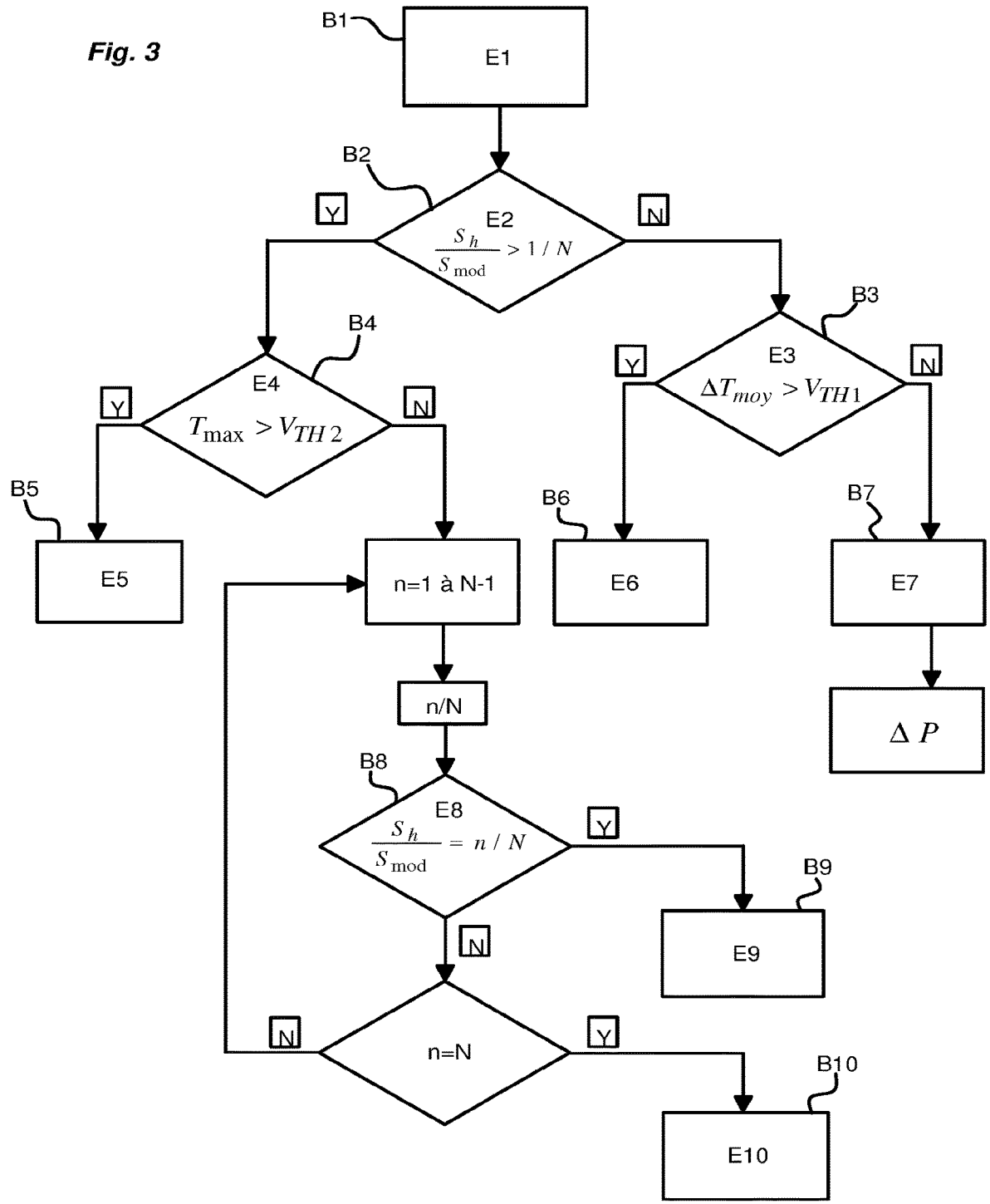
FIG. 3 shows a flow chart illustrating the detection algorithm executed by the detection system.

The module for determining the type of fault of the monitored photovoltaic module Mi draws on the algorithm shown in FIG. 3. This algorithm is executed by the microprocessor 30 when a hot thermal zone Zh has been detected on the monitored module Mi, and when it is therefore necessary to determine what the fault present on this module is.

This algorithm includes the blocks described below, each representative of the implementation of a separate step of the fault detection method of the invention.

It should be noted that, if the module Mi includes a plurality of separate hot thermal zones Zh, the algorithm applies to all of these zones taken in combination.

Block B1—Step E1

This is the step of acquiring temperature data, be this using the thermal camera 2 and/or temperature sensors, and of determining the temperature matrix. A temperature is thus assigned to each thermal zone, so as to form the temperature matrix of the monitored module.

In this step, this also involves determining the reference temperature Tref by executing the module 36 for obtaining the reference temperature.

The various software modules already described above are executed in order to establish the temperature matrix of the defective monitored module.

Block B2—Step E2

This step consists in evaluating the scale of the hot thermal zone Zh detected on the monitored module. The surface area of the hot thermal zone is determined by virtue of the module 33 for determining the respective surface areas of the various divided thermal zones.

This step thus consists in determining the surface area ratio $S_h/S_{mod}$ between the surface area $S_h$ occupied by the hot thermal zone of the monitored module and the total surface area $S_{mod}$ of the module. In other words, this involves determining the level of occupation of each hot thermal zone Zh with respect to the total surface area $S_{mod}$ of the module. The total surface area of the module corresponds to the surface area of the module supposed to receive light radiation. If the module includes a plurality of hot thermal zones Zh, the surface area corresponds to that of all of the detected hot thermal zones. The term surface area should be understood to mean the geometrical concept of area.

This surface area ratio $S_h/S_{mod}$ is compared with a coefficient equal to 1/N, wherein N corresponds to the number of bypass diodes that are present in the monitored module. This number N is known and stored beforehand in the storage means of the processing unit 3. The comparison is implemented by a comparison module executed in the processing unit.

This comparison thus makes it possible to determine whether the hot thermal zone Zh impacts one or more groups of cells (each bypass diode being associated with a group of photovoltaic cells—a group may include one or more cells).

Block B3—Step E3

If the comparison carried out in preceding step E2 is negative (branch N), a new test step is implemented. A test module is executed in the processing unit 3.

This step E3 consists in determining whether the temperature difference $\Delta T_{av}$ between the average temperature of the faulty module and the average temperature of the reference module Mref, this temperature corresponding to the reference temperature Tref, exceeds a threshold value $V_{TH1}$. The threshold value $V_{TH1}$ is for example between 1.8° C. and 4° C., advantageously equal to 2° C.

Block B6—Step E6

If the temperature difference $\Delta T_{av}$ determined in step E3 is greater than the threshold value $V_{TH1}$, the processing unit 3 concludes therefrom that the whole module Mi is defective (fault of the 3rd type).

Block B7—Step E7

If the temperature difference $\Delta T_{av}$ determined in step E3 is not greater than the threshold value $V_{TH1}$, the processing unit 3 concludes therefrom that the fault present is a hotspot (fault of the 1st type).

After detecting the hotspot, the processing unit 3 is able to determine the energy production loss $\Delta P$ of the photovoltaic module Mi caused by this hotspot on the thermal zone $Z_h$. This energy production loss is determined from the following relationship:

$$\Delta P = U_{pv} \cdot S_h \cdot (T_h - T_{ref})$$

In which:
- $U_{pv}$ corresponds to a heat-exchange coefficient of the module;
- $S_h$ corresponds to the surface area of the hot thermal zone $Z_{ij}$;
- $T_h$ corresponds to the temperature of the hot thermal zone $Z_{ij}$;
- $T_{ref}$ corresponds to the reference temperature of the reference module.

A calculation module is then executed in the processing unit 3 in order to calculate this energy loss.

With regard to the calculation of the energy loss, additional information is available in patent application WO2016/189052A1, which is hereby incorporated by reference.

Block B4—Step E4

If the comparison carried out in step E2 is positive (branch Y), a new test step is implemented. A new test module is then executed in the processing unit 3.

This test step consists in checking whether the maximum temperature $T_{max}$ of the hot thermal zone is greater than a threshold value $V_{TH2}$.

This threshold value $V_{TH2}$ is chosen to be greater than the reference temperature Tref of the reference module Mref, for example equal to a value between 110% and 140%, ideally 130%, of said reference temperature of the reference module Mref.

Block B5—Step E5

If the comparison carried out in step E4 is positive (branch Y), the processing unit 3 concludes that there is a failure of the module Mi in its entirety (fault of the 3rd type).

Block B8—Step E8

If the comparison carried out in step E4 is negative (branch N), the processing unit executes a specific module in the form of a loop. This loop makes it possible to determine the number of bypass diodes Db that are defective. This loop consists in comparing, upon each iteration, the surface area ratio $$\frac{S_h}{S_{mod}}$$

defined above in step E2 with a changing ratio equal to n/N, wherein n corresponds to the number of bypass diodes and is incremented by one unit upon each iteration up to N−1, N corresponding to the total number of bypass diodes in the monitored module.

The loop is executed for as long as the equation $$\frac{S_h}{S_{mod}} = \frac{n}{N}$$

is satisfied and for as long as n is not equal to N.

Block B9—Step E9

When the equation defined in step E8 is satisfied (branch Y) and n is less than or equal to N−1, the processing unit 3 concludes therefrom that there is a number n of defective diodes (fault of the $2^{nd}$ type). The processing unit 3 is able to deduce therefrom the energy production loss caused by the failure of the n bypass diodes.

Block B10—Step E10

If the equation defined in step E8 is never satisfied (branch N) and n=N, the processing unit concludes therefrom that the module is defective in its entirety (fault of the 3rd type).

Figure 4A:
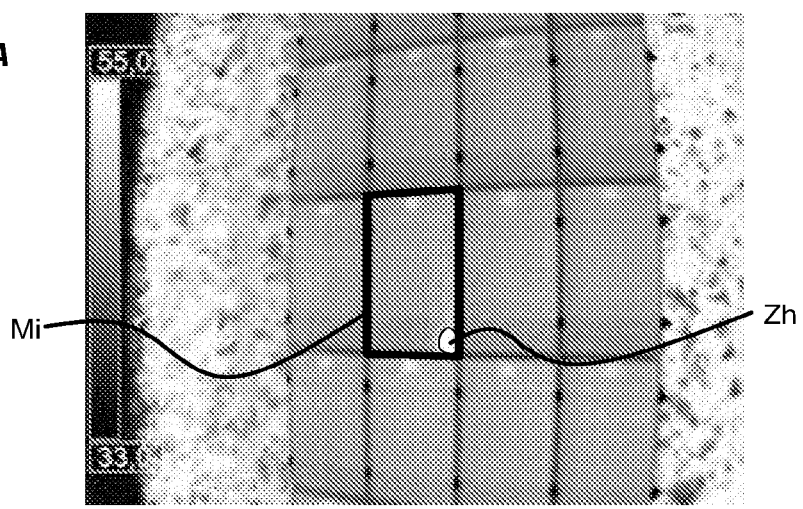
FIGS. 4A to 4C illustrate various malfunction scenarios on a photovoltaic module.
Figure 4B:
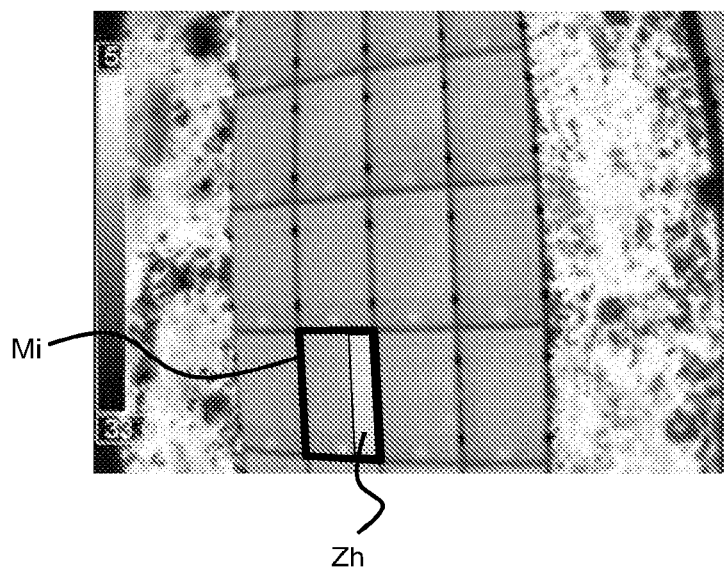
Figure 4C:
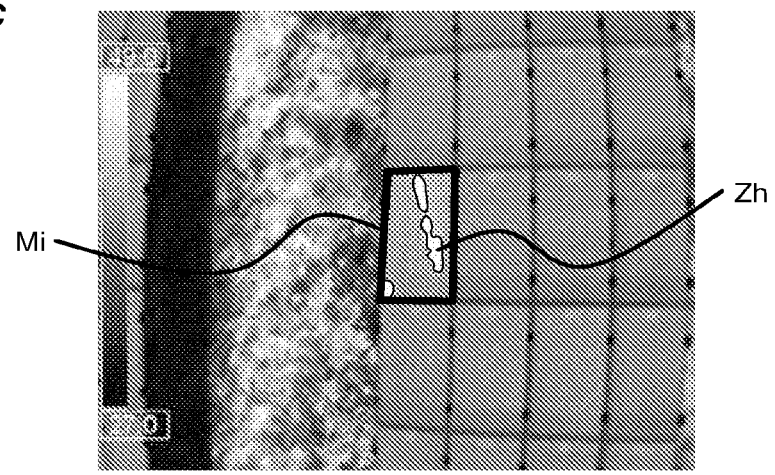

FIGS. 4A to 4C show three examples of faults present on a photovoltaic module.

In FIG. 4A, a fault of the 1st type is involved, that is to say a hotspot fault. The surface area $S_h$ of the hot thermal zone Zh represents 5% of the total surface area $S_{mod}$ of the module Mi. The temperature difference $\Delta T_{av}$ is 1° C. and therefore less than the threshold value $V_{TH1}$. The maximum temperature $T_{max}$ of the hot thermal zone is 180% the average temperature of the reference module Mref, and therefore greater than the threshold value $V_{TH2}$. By applying the above algorithm, the processing unit 3 will arrive at step E7, concluding that a hotspot is indeed involved.

In FIG. 4B, a fault of the 2nd type is involved, that is to say a defective bypass diode fault. The surface area $S_h$ of the hot thermal zone Zh represents 33% of the total surface area $S_{mod}$ of the module Mi. The maximum temperature $T_{max}$ of the hot thermal zone is less than the threshold value $V_{TH2}$. By applying the above algorithm, the processing unit 3 will arrive at step E9, concluding that a faulty bypass diode is involved.

In FIG. 4C, a fault of the 3rd type is involved, that is to say a module that is defective in its entirety. The surface area $S_h$ of the hot thermal zone Zh represents 35% of the total surface area $S_{mod}$ of the module Mi. In this example, it may be seen that the module even includes a plurality of separate hot thermal zones. The temperature difference $\Delta T_{av}$ is 3.29° C. and therefore greater than the threshold value $V_{TH1}$. By applying the above algorithm, the processing unit 3 will arrive at step E6, concluding that a module that is defective in its entirety is involved. The module is disconnected from the string.

According to one particular aspect of the invention, depending on the type of fault detected, a specific action may be initiated. This may be an alert informing an operator of the type of fault detected and indicating the action to be taken to clear this fault.

The invention described above, relating to the detection of a fault in a photovoltaic module, thus has numerous advantages, including:

Ease of implementation, in particular by using a simple thermal camera to capture a thermal image of the module. There is no need for a current or voltage sensor;

A reliable solution. Experimental results have shown that the energy losses determined by virtue of the solution of the invention were similar to those determined using a conventional method based on analysis of I-V curves. These results proved convincing regardless of the type of fault affecting the photovoltaic module;

A simple solution, as it requires only minimal processing. Once a thermal image of the photovoltaic module has been acquired, the algorithm to be executed is particularly simple.

A successful solution, in that it also makes it possible to determine the energy production loss caused by each type of fault detected.

The invention claimed is:

1. A method for detecting a fault in a photovoltaic module that includes a plurality of photovoltaic cells connected to one another and one or more bypass diodes, each bypass diode being configured to bypass one or more photovoltaic cells of said photovoltaic module, comprising:
   determining a matrix of temperatures of the photovoltaic module, said matrix being obtained after dividing the module into a plurality of thermal zones and assigning a temperature to each thermal zone;
   detecting at least one hot thermal zone from among said plurality of zones of the module;
   determining a surface area ratio between the surface area of the detected hot thermal zone and the total surface area of the module;
   performing a first comparison of said surface area ratio with a coefficient dependent on the number of bypass diodes present in the module; and
   determining the type of fault from the result obtained in said first comparison.

2. The method according to claim 1, wherein said first comparison comprises comparing said surface area ratio with said coefficient equal to 1/N, wherein N corresponds to the number of bypass diodes present in the module, for the purpose of obtaining a first option or a second option according to said result of the comparison.

3. The method according to claim 2, wherein said first option comprises:
   determining a temperature difference between said average temperature of the photovoltaic module and a reference temperature obtained on a reference photovoltaic module;
   performing a second comparison of said temperature difference with a threshold value; and
   determining the type of fault from the result of said second comparison between an overall failure of the module and a hotspot fault.

4. The method according to claim 3, wherein, when the fault is a hotspot fault, the method comprises determining an energy production loss of the photovoltaic module caused by said hotspot fault.

5. The method according to claim 2, wherein said second option comprises:
   obtaining a maximum temperature of said detected hot thermal zone;
   performing a third comparison of said maximum temperature with a threshold value greater than an average value of the temperatures of said reference module; and
   determining the type of fault from the result of said third comparison between an overall failure of the module and another type of fault.

6. The method according to claim 5, wherein, when another type of fault is involved, the method comprises a step of determining the number (n) of faulty bypass diodes.

7. A system for detecting a fault in a photovoltaic module that includes a plurality of photovoltaic cells connected to one another and one or more bypass diodes, each bypass diode being configured to bypass one or more photovoltaic cells of said photovoltaic module, the system comprising:
   a module for determining a matrix of temperatures of the photovoltaic module, said matrix being obtained after dividing the module into a plurality of thermal zones and assigning a temperature to each thermal zone;
   a module for detecting at least one hot thermal zone from among said plurality of zones of the module;
   a module for determining a surface area ratio between the surface area of the detected hot thermal zone and the total surface area of the module;
   a first comparison module configured to implement a comparison of said surface area ratio with a coefficient dependent on a number N of bypass diodes present in the module; and
   a module for determining the type of fault from the result obtained by said first comparison module.

8. The system according to claim 7, wherein said first comparison module is configured to compare said surface area ratio with said coefficient equal to 1/N, wherein N corresponds to the number of bypass diodes present in the module, for the purpose of obtaining a first option or a second option according to said result of the comparison.

9. The system according to claim 8, wherein the system is configured to execute, in said first option:
   a module for determining a temperature difference between an average temperature of the photovoltaic module and a reference temperature obtained on a reference photovoltaic module;
   a second comparison module configured to implement a comparison of said temperature difference with a threshold value; and a module for determining the type of fault from the result of said comparison implemented by said second comparison module, between an overall failure of the module and a hotspot fault.

10. The system according to claim 9, wherein when the fault is a hotspot fault, the system is configured to execute a module for determining an energy production loss of the photovoltaic module caused by said hotspot fault.

11. The system according to claim 8, wherein the system is configured to execute, in said second option:
- a module for obtaining a maximum temperature of said detected hot zone;
- a third comparison module configured to implement a comparison of said maximum temperature with a threshold value greater than an average value of the temperatures of said reference module; and
- a module for determining the type of fault from the result of said comparison implemented by said third comparison module, between an overall failure of the module and another type of fault.

12. The system according to claim 11, wherein, when another type of fault is involved, the system is configured to execute a module for determining a number of faulty bypass diodes.

\* \* \* \* \*